United States Patent
Colinge

(10) Patent No.: US 9,111,996 B2
(45) Date of Patent: Aug. 18, 2015

(54) SEMICONDUCTOR-ON-INSULATOR STRUCTURE AND METHOD OF FABRICATING THE SAME

(71) Applicant: Taiwan Semiconductor Manufacturing Company Limited, Hsinchu (TW)

(72) Inventor: Jean-Pierre Colinge, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/055,229

(22) Filed: Oct. 16, 2013

(65) Prior Publication Data
US 2015/0102471 A1    Apr. 16, 2015

(51) Int. Cl.
*H01L 21/762*    (2006.01)
*H01L 29/16*    (2006.01)
*H01L 21/02*    (2006.01)

(52) U.S. Cl.
CPC .... *H01L 21/76251* (2013.01); *H01L 21/02524* (2013.01); *H01L 21/02592* (2013.01); *H01L 21/02667* (2013.01); *H01L 29/16* (2013.01)

(58) Field of Classification Search
CPC .............. C30B 1/023; H01L 21/02532; H01L 21/02381; H01L 21/0245; H01L 21/02502; H01L 21/02592
USPC ......... 438/310, 341, 357, 402, 413, 471, 478, 438/481, 482, 486, 269; 257/190, 349, 487, 257/496, 546
See application file for complete search history.

(56) References Cited

U.S. PATENT DOCUMENTS 6,699,764 B1 *    3/2004    Tweet et al. ................... 438/305
2007/0210307 A1 *    9/2007    Hebras ............................ 257/52

OTHER PUBLICATIONS

Colinge, Cynthia, Roberds, Brian, Doyle, Brian; Silicon Layer Transfer Using Wafer Bonding and Debonding; Journal of Electronic Materials, 30(7); pp. 841-844; 2001.
Colinge, Jean-Pierre; Silicon-on-Insulator Technology: Materials to VLSI, 3rd Edition; Kluwer Academic Publishers, Boston: MA; 2004.
Duffy, R., Shayesteh, M., McCarthy, B., Blake, A., White, M., Scully, J., Yu, R., Kelleher, A.-M., Schmidt, M., Petkov, N., Pelaz, L.,Marques, L.A.; The Curious Case of Thin-Body Ge Crystallization; Applied Physics Letters, 99; pp. 131910-1-131910-3; 2011.
Moriceau, H., Rayssac, O., Aspar, B., Ghyselen, B.; The Bonding Energy Control: An Original Way to Obtain "Debondable Substrates"; Electrochemical Society Proceedings, 2003(19); pp. 49-56; 2003.

* cited by examiner

*Primary Examiner* — David Vu
*Assistant Examiner* — Jonathan Han
(74) *Attorney, Agent, or Firm* — Jones Day

(57) ABSTRACT

Methods for forming a layer of semiconductor material are provided. A substrate is provided. An amorphous layer is formed over the substrate, where the amorphous layer includes a semiconductor or a semiconductor alloy. A seed wafer is bonded to the amorphous layer, where the seed wafer includes a crystalline semiconductor structure. A solid-phase epitaxial (SPE) growth process is performed to crystallize the amorphous layer, where the SPE growth process uses the crystalline semiconductor structure of the seed wafer as a crystal template. The seed wafer is debonded from the structure.

21 Claims, 4 Drawing Sheets

SEMICONDUCTOR-ON-INSULATOR STRUCTURE AND METHOD OF FABRICATING THE SAME

TECHNICAL FIELD

The technology described in this document relates generally to semiconductor structures and more particularly to semiconductor-on-insulator structures and methods for fabricating semiconductor-on-insulator structures.

BACKGROUND

In bulk semiconductor substrates, an active semiconductor region of a transistor may be disposed in a well region, where the well region is located within a bulk semiconductor region. In such structures, junction capacitance between the well region and the bulk semiconductor region may impact device performance. By contrast, some microelectronic devices place active semiconductor regions in an upper semiconductor layer of a semiconductor-on-insulator ("SOI") substrate. The upper semiconductor layer may be separated from a bulk semiconductor region of the substrate by an insulating layer such as a buried oxide ("BOX") layer. The insulating layer may improve device performance by eliminating junction capacitance between the upper semiconductor layer and the bulk semiconductor region.

SUMMARY

The present disclosure is directed to a method for forming a layer of semiconductor material. In a method for forming a layer of semiconductor material, a substrate is provided. An amorphous layer is formed over the substrate, where the amorphous layer includes a semiconductor or a semiconductor alloy. A seed wafer is bonded to the amorphous layer, where the seed wafer includes a crystalline semiconductor structure. A solid-phase epitaxial (SPE) growth process is performed to crystallize the amorphous layer, where the SPE growth process uses the crystalline semiconductor structure of the seed wafer as a crystal template. The seed wafer is debonded from the structure.

In another example, in a method for forming a layer of semiconductor material, a bulk silicon substrate is provided. An oxide layer is formed over the bulk silicon substrate. An amorphous layer is deposited over the oxide layer, where the amorphous layer includes a semiconductor or a semiconductor alloy. A seed wafer is bonded to the amorphous layer, where the seed wafer includes a crystalline semiconductor structure. A structure comprising the bulk silicon substrate, the oxide layer, the amorphous layer, and the seed wafer is annealed, where the annealing recrystallizes the amorphous layer using the crystalline semiconductor structure as a crystal template. The seed wafer is debonded from the structure. A second oxide layer is formed over the recrystallized amorphous layer. The steps of depositing, bonding, annealing, and debonding are repeated to form a second recrystallized amorphous layer over the second oxide layer.

In another example, a semiconductor-on-insulator structure includes a substrate and an oxide layer formed over the substrate. The semiconductor-on-insulator structure further includes a crystalline semiconductor layer formed over the oxide layer. Forming the crystalline semiconductor layer includes depositing an amorphous layer over the oxide layer, where the amorphous layer includes a semiconductor or a semiconductor alloy. The forming further includes bonding a seed wafer to the amorphous layer, where the seed wafer includes a crystalline semiconductor structure. The crystalline semiconductor layer is formed by annealing the amorphous layer and the seed wafer, where the annealing crystallizes the amorphous layer using the crystalline semiconductor structure of the seed wafer as a crystal template. The seed wafer is debonded from the structure.

DETAILED DESCRIPTION

Figure 1:
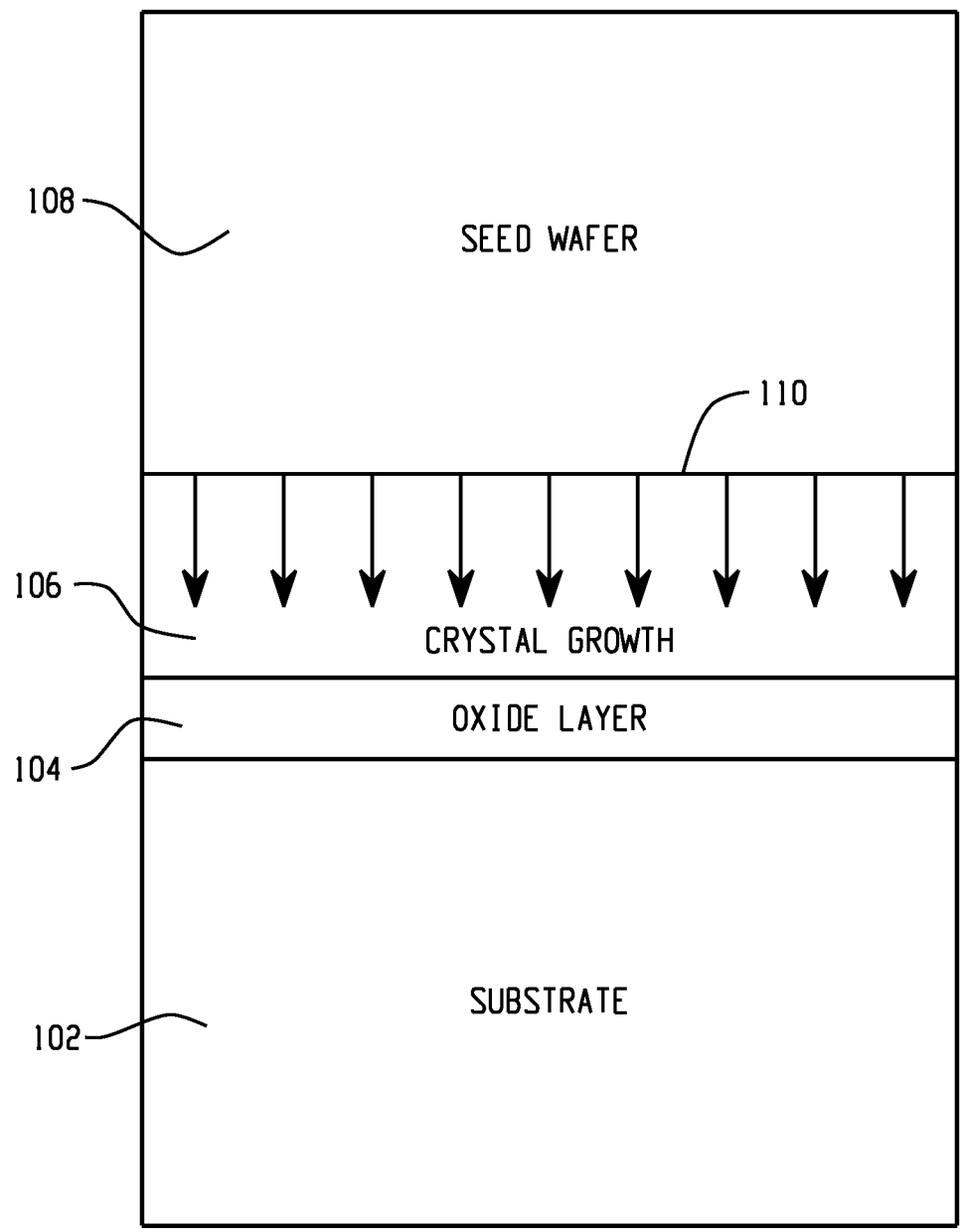
FIG. 1 depicts an example solid-phase epitaxial (SPE) growth process used to crystallize an amorphous semiconductor layer to form a semiconductor-on-insulator (SOI) structure.

FIG. 1 depicts an example solid-phase epitaxial growth process used to crystallize an amorphous semiconductor layer 106 to form a semiconductor-on-insulator (SOI) structure. In the example of FIG. 1, a combination of a bonding process and a solid-phase epitaxial growth process may be used to form a single-crystal semiconductor layer substantially over an insulator layer 104. Specifically, an oxide layer 104 may be formed substantially over a substrate 102. The oxide layer 104 may be, for example, a silicon oxide layer, a silicon dioxide layer, or a layer comprising another insulating material. The substrate 102 may be, for example, a bulk silicon substrate or another semiconductor substrate. The amorphous layer 106 may be formed substantially over the oxide layer 104, where the amorphous layer 106 includes a semiconductor material or a semiconductor alloy material (e.g., amorphous germanium, amorphous silicon, etc.).

A seed wafer 108 may be bonded to the amorphous layer 106. The seed wafer 108 may include a crystalline semiconductor structure. The seed wafer 108 may be, for example, a crystalline silicon substrate having a (100), (110), (111), or other crystal orientation, a sapphire wafer, a crystalline SiGe wafer, or a wafer of another crystalline material with suitable lattice parameters.

The solid-phase epitaxial growth process (which may also be referred to herein as a "regrowth" process) may be performed to crystallize the amorphous layer 106 (e.g., convert the amorphous layer 106 into a layer including a crystalline structure), where the growth process may use the crystalline semiconductor structure of the seed wafer 108 as a crystal template. Thus, the solid-phase epitaxial growth process may begin at an interface 110 between the seed wafer 108 and the amorphous layer 106, and may proceed downward through an entirety of a thickness of the amorphous layer 106. The solid-phase epitaxial growth process may cause an entirety of the amorphous layer 106 to become a single-crystal semiconductor layer.

After performing the solid-phase epitaxial growth process, the seed wafer 108 may be debonded from the structure, such that the layers 102, 104, 106 may then comprise a semiconductor-on-insulator (SOI) structure. After depositing a second insulating layer substantially over the SOI structure (not depicted in the example of FIG. 1), the steps described above may be repeated one or more times to form a succession of insulator layers and single-crystal semiconductor layers. The repeated steps may include forming a second amorphous layer substantially over the second insulating layer, bonding a seed wafer to the second amorphous layer, recrystallizing the second amorphous layer using a solid-phase epitaxial growth process, and debonding the seed wafer.

As illustrated in FIG. 1, the solid-phase epitaxial growth process may be a "top-down" growth process, where the crystal template for the growth process may be located in the foreign seed wafer 108 that is bonded to a top surface of the amorphous layer 106. The top-down growth process may be in contrast to conventional, "bottom-up" techniques that utilize a crystal template for a regrowth process that is located below an amorphous layer to be recrystallized. In the conventional, bottom-up techniques, the crystal template for regrowth may not come from a foreign wafer, but may rather come from a layer over which the amorphous layer was deposited or formed. In the top-down regrowth process of FIG. 1, because the seed crystal comes from a foreign wafer that is not located at a bottom of the structure, the seed crystal may be debonded, such that the stacking and regrowth process can be repeated multiple times. For each repeated regrowth process, "fresh" crystal information may be used (e.g., crystal information from the foreign seed wafer that is not a layer of the structure), such that there may not be degradation of the crystal quality as the number of recrystallized layers increases.

The example process of FIG. 1 may allow layers of different semiconductor materials with different crystal orientations and different levels of stress and strain to be fabricated in a stack structure, where the semiconductor layers are separated by insulating materials as described above. The process described herein may require only coarse alignment of the wafers to be bonded, where the coarse alignment may be less exacting as compared to a precision alignment required for conventional fabrication techniques (e.g., precision alignment that may include challenging through-wafer alignment using infrared light, where germanium and other semiconductor materials may not be transparent to the infrared light).

Figure 2A:
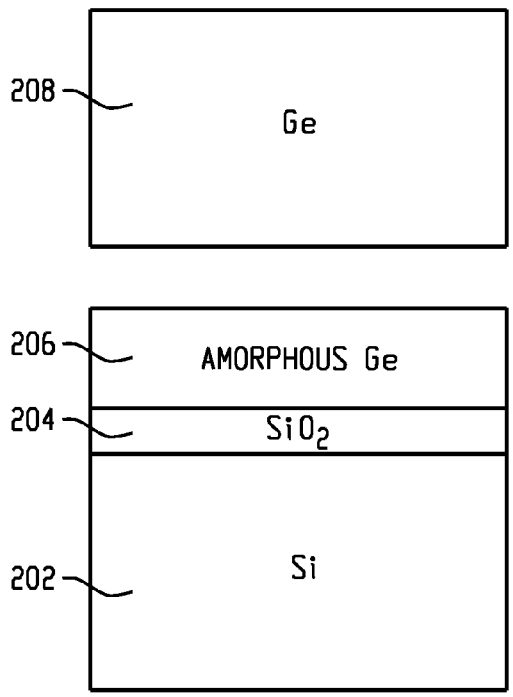
FIG. 2A depicts a beginning structure used in an example method of forming a layer of semiconductor material.

FIG. 2A depicts a beginning structure used in an example method of forming a layer of semiconductor material. In the beginning structure, an oxide layer 204 may be formed (e.g., via a growth process, a deposition process, an oxidation process, etc.) substantially over a substrate 202. The oxide layer 204 may be silicon oxide, silicon dioxide (i.e., as depicted in the example of FIG. 2A), or another insulating material. The substrate may be a bulk silicon wafer (i.e., as depicted in the example of FIG. 2A) or another type of substrate (e.g., a semiconductor substrate or an insulating substrate like glass).

An amorphous layer 206 may be formed substantially over the oxide layer 204 via a deposition or growth process. The amorphous layer 206 may include a semiconductor material or a semiconductor alloy material, and may be, specifically, an amorphous germanium layer (i.e., as depicted in the example of FIG. 2A), an amorphous silicon layer, or another amorphous semiconductor or semiconductor alloy layer. After forming the amorphous layer 206 substantially over the oxide layer 204, a chemical mechanical planarization (CMP) process may be used to planarize and smooth the amorphous layer 206, and the amorphous layer 206 may also be cleaned to remove a native oxide layer on the amorphous layer 206. Although the example of FIG. 2A depicts the amorphous layer 206 being formed substantially over the oxide layer 204 (e.g., such that a semiconductor-on-insulator structure may be formed, as depicted in FIG. 2F), in other examples, the amorphous layer 206 may be formed substantially over the substrate 202.

FIG. 2A also depicts a seed wafer 208. In the example of FIG. 2A, the seed wafer 208 may be separate from the amorphous layer 206 (e.g., the seed wafer 208 is depicted as being separate from the amorphous layer 206 prior to a bonding process that is described below with reference to FIG. 2B). The seed wafer 208 may include a crystalline semiconductor structure, and may include, for example, a crystalline germanium wafer (i.e., as depicted in the example of FIG. 2A), a crystalline silicon layer having a (100), (110), (111), or another crystal orientation, a sapphire wafer, or a crystalline SiGe wafer or a wafer of another crystalline material with suitable crystal lattice parameters. A CMP process may be used to planarize and smoothen the seed wafer 208, and the seed wafer 208 may also be cleaned to remove a native oxide layer on the seed wafer 208. The CMP and cleaning processes that may be applied to the amorphous layer 206 and the seed wafer 208 may be performed to improve a quality of a bond between the amorphous layer 206 and the seed wafer 208 (e.g., to achieve an atomic contact between the layers), as described below with reference to FIG. 2B.

Figure 2B:
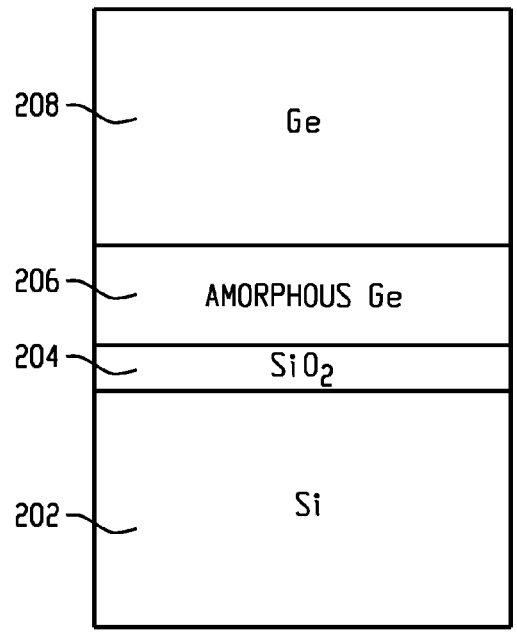
FIG. 2B depicts a bonding of a seed wafer to an amorphous semiconductor layer.

FIG. 2B depicts a bonding of the seed wafer 208 to the amorphous semiconductor layer 206. In bonding the seed wafer 208 to the amorphous layer 206, the bond strength may be such that atomically-intimate contact is formed between the layers 206, 208, while still allowing the seed wafer 208 to be debonded following a solid-phase epitaxial regrowth process (as described below with reference to FIG. 2E). The bonding process illustrated in FIG. 2B may utilize, for example, a hydrogen plasma, hydrofluoric acid (HF), hydrochloric acid (HCl), or hydrobromic acid (HBr) for passivation or activation of the bonding surfaces, as necessary for the bonding.

In the example of FIG. 2B, the seed wafer 208 may become connected to the amorphous layer 206 via the above-described wafer-bonding process, where the wafer-bonding process is different from a deposition process or a growth process. Thus, the bonding process of FIG. 2B may occur after the formation of the amorphous layer 206 substantially over the oxide layer 204, where the amorphous layer 206 may be deposited or grown over the oxide layer 204 and may not be deposited or grown over the seed wafer 208. The bonding process of FIG. 2B may utilize only a coarse alignment of the seed wafer 208 with the structure including the amorphous layer 206, the oxide layer 204, and the substrate 202. The coarse alignment procedure may be in contrast to a precision alignment that may be used in other techniques for producing a semiconductor-on-insulator structure.

Figure 2C:
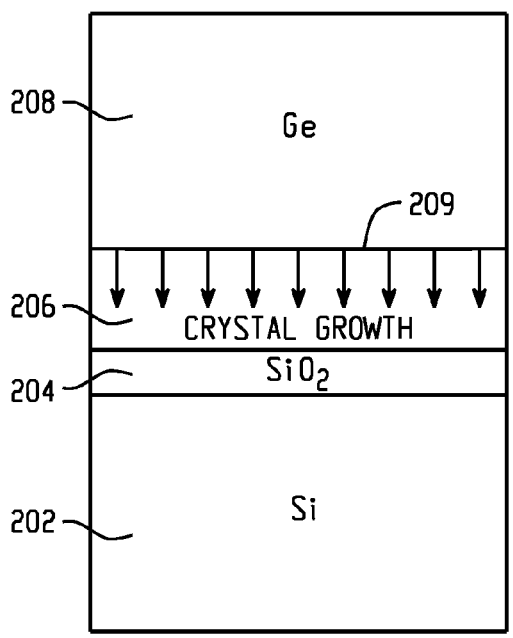
FIG. 2C depicts an annealing used to recrystallize the amorphous semiconductor layer using a crystalline semiconductor structure of the seed wafer as a crystal template.

FIG. 2C depicts an annealing process used to recrystallize the amorphous semiconductor layer 206 using a crystalline semiconductor structure of the seed wafer 208 as a crystal template. In FIG. 2C, following the bonding of the seed wafer 208 to the amorphous layer 206, as depicted in FIG. 2B, a bonding interface 209 may exist between the seed wafer 208 and the amorphous layer 206. The annealing may enable a solid-phase epitaxial regrowth process to occur in the amorphous layer 206, where the solid-phase epitaxial regrowth process may be used to recrystallize the amorphous layer 206. The solid-phase epitaxial regrowth process may use the crystalline semiconductor structure of the seed wafer 208 as a crystal template in crystallizing the amorphous layer 206. In certain examples, the amorphous layer 206 may be doped with impurities to facilitate or accelerate the solid-phase epitaxial regrowth process.

As depicted in FIG. 2C, the recrystallization process may begin from the bonding interface 209 and may thereafter proceed downward through an entirety of a thickness of the amorphous layer 206. As described above with reference to FIG. 1, such a recrystallization process beginning from the foreign seed wafer 208 that is located above the amorphous layer 206 may be termed a "top-down" regrowth process (e.g., in contrast to conventional, "bottom-up" regrowth processes that may use a seed crystal of a non-foreign layer located beneath the layer to be recrystallized). In the top-down regrowth process of FIG. 2C, because the seed wafer 208 is not located at a bottom of the structure (e.g., the seed wafer 208 is a foreign wafer that is not used to provide structural support for the structure), the seed wafer 208 may be debonded and reused (e.g., as described below with reference to FIGS. 2E and 2G), such that the stacking and regrowth process can be repeated multiple times.

The solid-phase epitaxial growth process may use an annealing process, where the structure including the seed wafer 208, the amorphous layer 206, the oxide layer 204, and the substrate 202 are annealed. Specifically, the annealing process may utilize a low temperature that does not cause damage to the structure or to devices formed in the structure. The temperature of the annealing process may be lower than that used in certain conventional fabrication techniques (e.g., conventional fabrication techniques for stacking a single active layer on top of a chip that use hydrogen implant and splitting processes and require high temperature annealing that may be damaging to devices or metal layers used in the devices).

In one example, the amorphous layer 206 may include an amorphous germanium layer and the seed wafer 208 may include a crystalline germanium wafer (i.e., as depicted in the example of FIG. 2C), and an annealing temperature for the solid-phase epitaxial regrowth may be within a range of approximately 400 to 600 degrees Celsius. In another example, the amorphous layer 206 may include an amorphous silicon layer and the seed wafer 208 may include a crystalline silicon wafer, and an annealing temperature for the solid-phase epitaxial regrowth may be within a range of approximately 550 to 650 degrees Celsius. The low temperature of the annealing process may facilitate debonding of the seed wafer 208 from the amorphous layer 206.

Figure 2D:
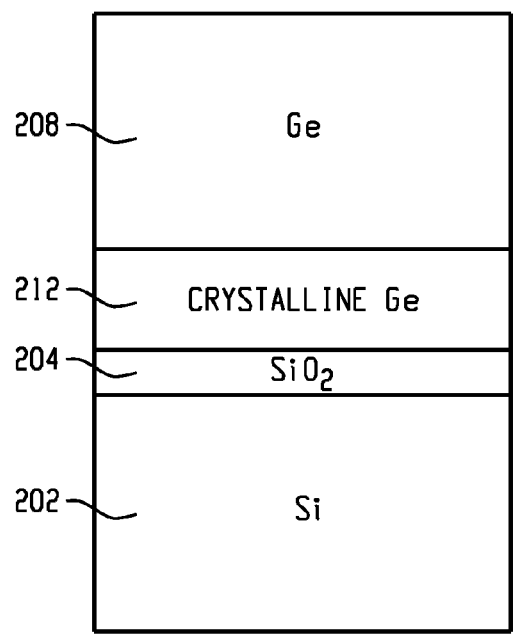
FIG. 2D depicts a crystalline semiconductor layer formed as a result of a solid-phase epitaxial regrowth process.

FIG. 2D depicts a crystalline semiconductor layer 212 formed as a result of the solid-phase epitaxial regrowth process. The crystalline semiconductor layer 212 may be a single-crystal semiconductor layer that is formed on the oxide layer 204. Although the example of FIG. 2D depicts a creation of a crystalline germanium layer, the crystalline semiconductor layer 212 may be comprised of various other semiconductor materials and semiconductor alloy materials. As described above, for example, the crystalline semiconductor layer 212 may be comprised of crystalline silicon. The crystalline semiconductor layer 212 may be of various different crystal orientations. For example, the seed wafer 208 used for the solid-phase epitaxial regrowth process may be a silicon wafer (e.g., having a (100), (110), or (111) crystal orientation) or a sapphire wafer having various crystal orientations. The regrowth process may cause the crystalline semiconductor layer 212 to take on the crystal orientation of the seed wafer 208 and may thus allow the crystalline semiconductor layer 212 to have a variety of different crystal orientations.

In one example, a relaxed SiGe seed wafer 208 may be used in the recrystallization process, where the SiGe seed wafer 208 may be used to recrystallize either amorphous silicon or amorphous germanium. Specifically, when using the SiGe seed wafer 208, recrystallizing an amorphous silicon layer or an amorphous germanium layer may cause stress or strain in the resulting crystalline silicon layer or crystalline germanium layer. For example, a resulting crystalline silicon layer 212 formed using the relaxed SiGe seed wafer 208 may be under tensile stress, where the tensile stress may increase electron mobility in the crystalline silicon layer 212. As another example, a resulting crystalline germanium layer 212 formed using the relaxed SiGe seed wafer 208 may be under compressive stress, where the compressive stress may increase hole mobility in the crystalline germanium layer 212. Various other combinations of seed layer 208 materials and amorphous layer 206 materials may be selected such that the resulting crystalline semiconductor layer 212 may have a level of stress or strain.

Figure 2E:
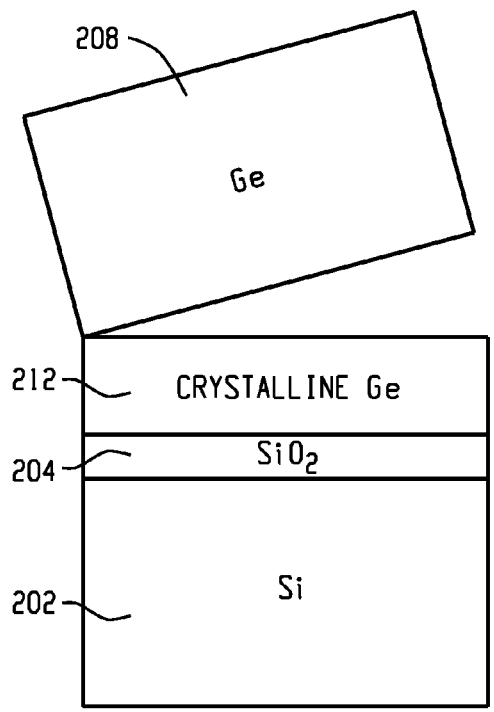
FIG. 2E depicts the seed wafer being debonded from the structure.
Figure 2F:
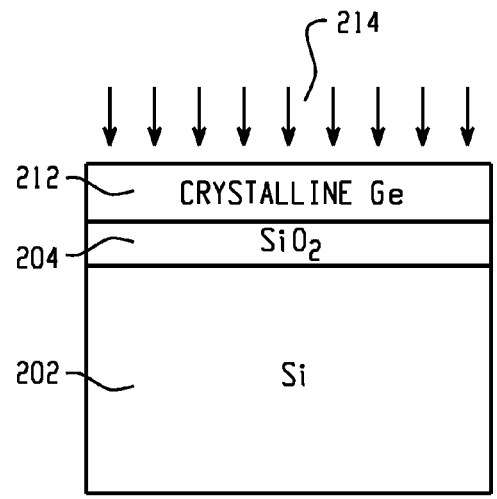
FIG. 2F depicts a chemical mechanical planarization (CMP) process being performed on the structure.

FIG. 2E depicts the seed wafer 208 being debonded from the structure. As described above, the bond strength between the seed layer 208 and the crystalline semiconductor layer 212 may be such that atomically-intimate contact is formed between the layers 208, 212, while still allowing the seed wafer 208 to be debonded following the solid-phase epitaxial regrowth process. Thus, as depicted in FIG. 2E, the seed wafer 208 may be debonded from the crystalline semiconductor layer 212 using various conventional debonding techniques.

Steps may be taken in the fabrication process to enable easier debonding of the seed wafer 208. For example, prior to the bonding of the seed wafer 208, the amorphous layer 206 may be patterned (e.g., into chips) to facilitate recrystallization and debonding. For example, lines may be patterned into the amorphous layer 206, where the lines are areas in which the amorphous material is removed (e.g., trenches). The lines of the removed amorphous material in the amorphous layer 206 may not reach a bottom of the amorphous layer 206 (i.e., the lines may not extend to the substrate 202). Alternatively, the patterned lines may be in the seed wafer 208 instead of in the amorphous layer 206. As another example of a step that may be taken in the fabrication process to facilitate debonding of the seed wafer 208, special treatment may be applied at a wafer rim of the amorphous layer 206. Alternatively, the special treatment may be applied to the rim of the seed wafer 208. The special treatment may include, for example, local bonding deactivation or recessing of the amorphous layer 206 (e.g., via the lines that include areas in which the amorphous material is removed, as described above). As another example, ions such as H, F, He, or Cl may be introduced in the amorphous layer 206 (e.g., via an ion implantation technique) to facilitate debonding of the seed layer 208.

FIG. 2F depicts a chemical mechanical planarization (CMP) process 214 being performed on the structure. The CMP process 214 may be performed following the debonding process of FIG. 2E, where the CMP process 214 may be used to planarize, smooth (e.g., eliminate surface roughness), and thin the crystalline semiconductor layer 212 or remove impurities present on a surface of the crystalline semiconductor layer 212 following the debonding process. As illustrated in FIG. 2F, the resulting structure may comprise a semiconductor-on-insulator structure.

Figure 2G:
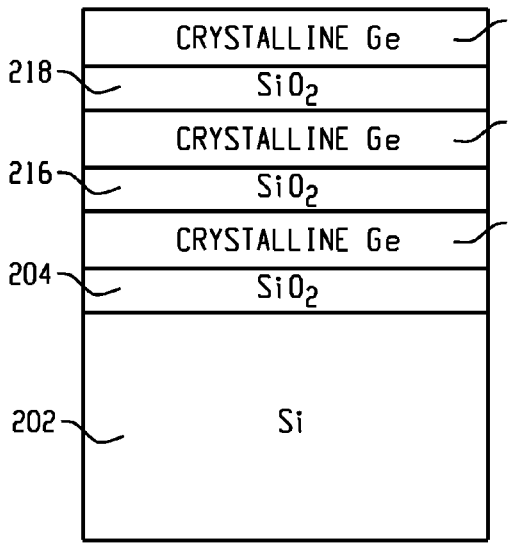
FIG. 2G depicts the structure including a stack of layers, where the stack includes a succession of insulator layers and semiconductor layers.

FIG. 2G depicts the structure including a stack of layers, where the stack includes a succession of insulator layers 204, 216, 218 and semiconductor layers 212, 220, 222. The structure of FIG. 2G may be the result of repeating the steps described above with reference to FIGS. 2A-2F. Thus, after performing the debonding depicted in FIG. 2E and the optional CMP process 214 depicted in FIG. 2F, a second oxide layer 216 may be formed substantially over the crystalline semiconductor layer 212. A second amorphous layer 220 may be formed substantially over the second oxide layer 216. A second seed wafer (not depicted in FIG. 2G) may be bonded to the second amorphous layer 220, where the second seed wafer may include a crystalline semiconductor structure. A second annealing process may be performed to crystallize the second amorphous layer 220, where the second annealing process may use the crystalline semiconductor structure of the second seed wafer as a crystal template. Following the second annealing process, the second seed wafer may be debonded from the structure. These steps may be repeated in a similar manner to form a third oxide layer 218 and a third semiconductor layer 222. As described above, only coarse alignment may be utilized in forming the stack, thus potentially overcoming issues caused by the precise alignment requirements of conventional fabrication techniques.

The bonding, epitaxial regrowth, and debonding steps described above with reference to FIGS. 2A-2G may be repeated at will to form a stack comprising a succession of insulator layers and crystalline semiconductor layers. In forming the stack, the seed layer may be reused one or more times (i.e., in the example of FIG. 2G, the second seed wafer may be the same as the seed wafer 208). Alternatively, to form crystalline semiconductor layers 212, 220, 222 of different crystal orientations or different stress and strain levels, for example, the second seed layer may be different from the seed layer 208.

The amorphous materials that are recrystallized to form the crystalline semiconductor layers 212, 220, 222 may be varied between the layers 212, 220, 222. For example, although the example of FIG. 2G depicts the stack having crystalline semiconductor layers 212, 220, 222 that are each comprised of germanium, in another example, the layers 212, 222 may be comprised of silicon, and the layer 220 may be comprised of germanium. Any number of other combinations of seed layer materials and amorphous layer materials may be used.

Figure 3:
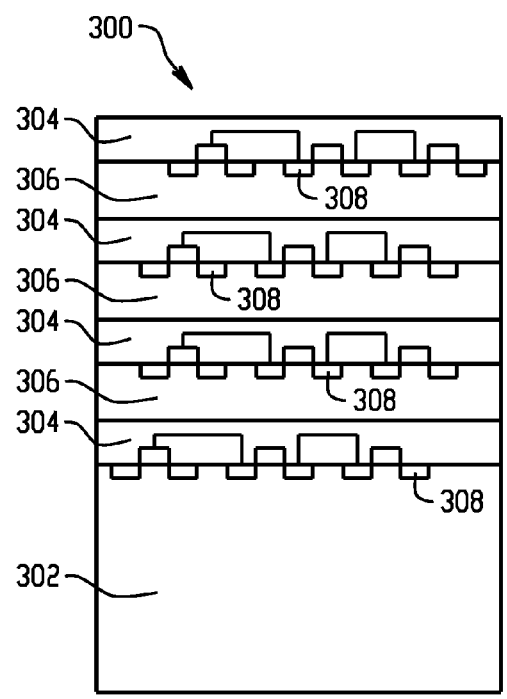
FIG. 3 depicts an example structure including a succession of insulator layers and semiconductor layers, where certain of the layers include devices formed therein.

FIG. 3 depicts an example structure 300 including a succession of insulator layers 304 and semiconductor layers 306, where certain of the layers 304, 306 include devices 308 formed therein. The succession of insulator layers 304 and semiconductor layers 306 may be fabricated on a substrate 302 in a manner that is similar to that described above with reference to FIGS. 2A-2G. In FIG. 3, the devices 308 (e.g., transistors) have been fabricated in the layers 304, 306, and various of the devices of the layers 304, 306 may be connected by inter-level vias and by electrical connections within a single layer. An Nth layer may be processed (e.g., to fabricate a device 308 in the Nth layer) before adding an (N+1)th layer.

For example, after fabricating a lowest semiconductor layer 306, the lowest semiconductor layer 306 may be processed to fabricate one or more devices 308 in the layer 306. Thereafter, a subsequent insulator layer 304 and a subsequent semiconductor layer 306 may be formed substantially over the lowest semiconductor layer 306. Because the annealing process used to form the subsequent semiconductor layer 306 may be a low temperature process (e.g., within a range of approximately 300-350 degrees Celsius to fabricate the subsequent semiconductor layer 306 to be crystalline germanium, and within a range of approximately 550-650 degrees Celsius to fabricate the subsequent semiconductor layer 306 to be crystalline silicon), the devices formed in the lowest semiconductor layer 306 may not be damaged by the temperatures used to form the subsequent semiconductor layer 306.

Figure 4:
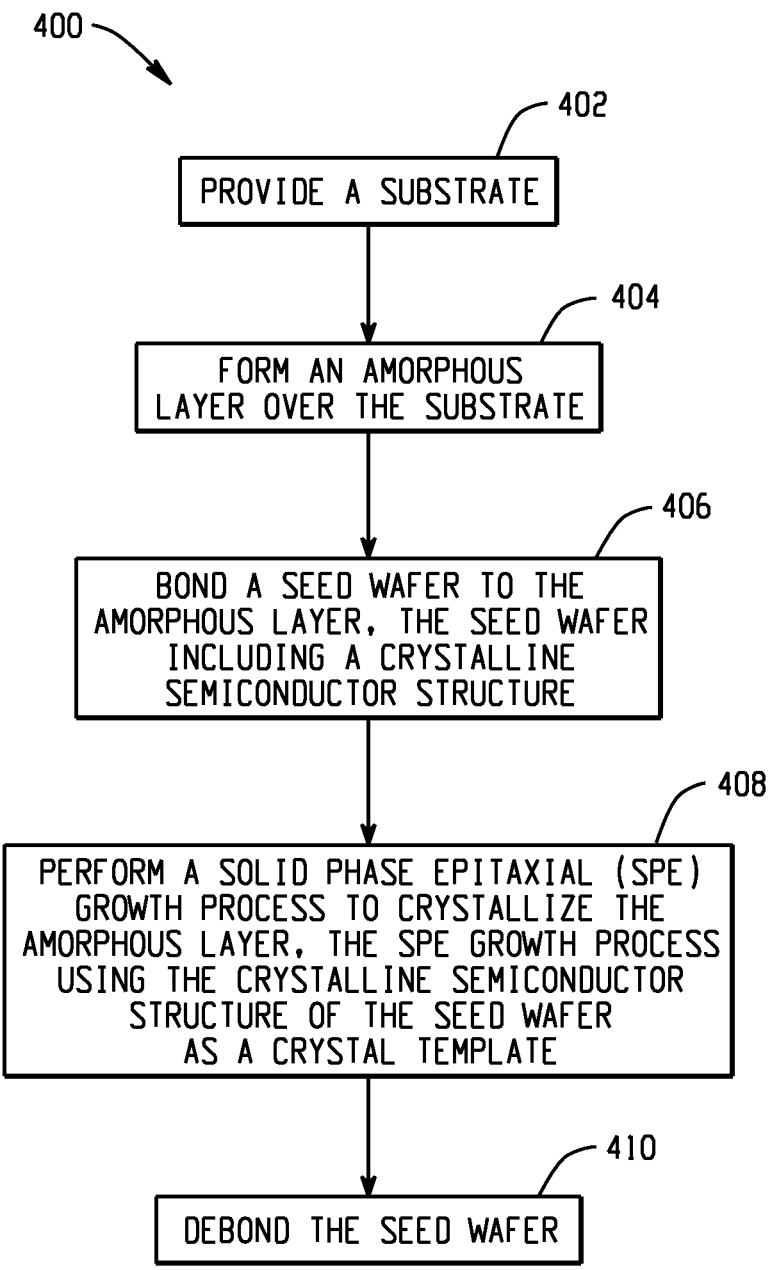
FIG. 4 is a flowchart illustrating an example method for forming a layer of semiconductor material.

FIG. 4 is a flowchart 400 illustrating an example method for forming a layer of semiconductor material. At 402, a substrate is provided. At 404, an amorphous layer is formed over the substrate, where the amorphous layer includes a semiconductor or a semiconductor alloy. At 404, a seed wafer is bonded to the amorphous layer, where the seed wafer includes a crystalline semiconductor structure. At 406, a solid-phase epitaxial (SPE) growth process is performed to crystallize the amorphous layer, where the SPE growth process uses the crystalline semiconductor structure of the seed wafer as a crystal template. At 408, the seed wafer is debonded from the structure.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method for forming a layer of semiconductor material, the method comprising:
    providing a substrate;
    forming an amorphous layer over the substrate, the amorphous layer including a semiconductor or a semiconductor alloy;
    bonding a seed wafer to the amorphous layer, the seed wafer including a crystalline semiconductor structure;
    performing a solid-phase epitaxial (SPE) growth process to crystallize the amorphous layer, the SPE growth process using the crystalline semiconductor structure of the seed wafer as a crystal template; and
    debonding the seed wafer.

2. The method of claim 1, further comprising:
    providing the substrate, wherein the substrate includes:
        a semiconductor base layer, and
        an oxide layer formed over the semiconductor base layer, wherein the amorphous layer is formed over the oxide layer of the substrate.

3. The method of claim 1, wherein the seed wafer is a sapphire wafer.

4. The method of claim 1, wherein the seed wafer is a silicon wafer having a (100), (110), or (111) crystal orientation.

5. The method of claim 1, wherein the seed wafer is a SiGe wafer, wherein the amorphous layer includes a silicon layer or a germanium layer, and wherein crystallizing the amorphous layer causes stress or strain in the silicon layer or the germanium layer.

6. The method of claim 1, further comprising:
performing the SPE growth process, wherein the amorphous layer is recrystallized using the seed wafer that is disposed above the amorphous layer, and wherein the recrystallization begins at an interface between the seed wafer and the amorphous layer.

7. The method of claim 1, further comprising:
bonding the seed wafer to the amorphous layer, wherein the bonding occurs after the forming of the amorphous layer over the substrate, and wherein the amorphous layer is deposited over the substrate and is not deposited over the seed wafer.

8. The method of claim 1, further comprising:
performing the SPE growth process to crystallize the amorphous layer, wherein the SPE growth process includes annealing a structure comprising the amorphous layer, the seed wafer, and the substrate.

9. The method of claim 8, wherein the annealing utilizes a low temperature that does not cause damage to the structure or to devices formed in the structure.

10. The method of claim 9, wherein the low temperature is within a range of approximately 400 to 600 degrees Celsius, wherein the amorphous layer includes amorphous germanium, and wherein the seed wafer includes crystalline germanium.

11. The method of claim 9, wherein the low temperature is within a range of approximately 580 to 650 degrees Celsius, wherein the amorphous layer includes amorphous silicon, and wherein the seed wafer includes crystalline silicon.

12. The method of claim 1, further comprising:
after debonding the seed wafer, performing a chemical mechanical planarization (CMP) process on the crystallized amorphous layer.

13. The method of claim 1, further comprising:
forming an oxide layer over the substrate prior to forming the amorphous layer;
forming the amorphous layer over the oxide layer, wherein the substrate includes silicon, wherein the oxide layer includes silicon oxide, wherein the amorphous layer includes amorphous germanium, and wherein the seed wafer includes crystalline germanium.

14. The method of claim 1, further comprising:
bonding the seed wafer to the amorphous layer, wherein the bonding is of a strength that i) causes the seed wafer and the amorphous layer to have an atomically-intimate contact, and ii) allows the seed wafer to be debonded from the amorphous layer.

15. The method of claim 1, further comprising:
after debonding the seed wafer, forming an oxide layer over the crystallized amorphous layer;
forming a second amorphous layer over the oxide layer;
bonding a second seed wafer to the second amorphous layer, the second seed wafer including a second crystalline semiconductor structure;
performing a second SPE growth process to crystallize the second amorphous layer, the second SPE growth process using the second crystalline semiconductor structure as a crystal template; and
debonding the second seed wafer.

16. The method of claim 15, wherein the second seed wafer is the seed wafer, such that the seed wafer is used for crystallizing both the amorphous layer and the second amorphous layer.

17. The method of claim 15, further comprising:
repeating the steps of forming an oxide layer, forming a second amorphous layer, bonding a second seed wafer, performing a second SPE growth process, and debonding the second seed wafer one or more times.

18. The method of claim 15, further comprising:
forming the amorphous layer using a first material; and
forming the second amorphous layer using a second material, wherein the first material is different from the second material.

19. The method of claim 15, further comprising:
bonding the seed wafer to the amorphous layer, wherein the seed wafer has a first crystal orientation; and
bonding the second seed wafer to the second amorphous layer, wherein the second seed wafer has a second crystal orientation that is different from the first crystal orientation.

20. The method of claim 15, further comprising:
bonding the seed wafer to the amorphous layer, wherein the seed wafer comprises a first material; and
bonding the second seed wafer to the second amorphous layer, wherein the second seed wafer comprises a second material that is different from the first material.

21. A method for forming a layer of semiconductor material, the method comprising:
providing a bulk silicon substrate;
forming an oxide layer over the bulk silicon substrate;
depositing an amorphous layer over the oxide layer, the amorphous layer including a semiconductor or a semiconductor alloy;
bonding a seed wafer to the amorphous layer, the seed wafer including a crystalline semiconductor structure;
annealing a structure comprising the bulk silicon substrate, the oxide layer, the amorphous layer, and the seed wafer, wherein the annealing recrystallizes the amorphous layer using the crystalline semiconductor structure as a crystal template;
debonding the seed wafer from the structure;
forming a second oxide layer over the recrystallized amorphous layer; and
repeating the steps of depositing, bonding, annealing, and debonding to form a second recrystallized amorphous layer over the second oxide layer.

* * * * *